(12) United States Patent  
Matsunaka et al.

(10) Patent No.: US 8,016,985 B2  
(45) Date of Patent: Sep. 13, 2011

(54) MAGNETRON SPUTTERING APPARATUS AND METHOD FOR MANUFACTURING SEMICONDUCTOR DEVICE

(75) Inventors: Shigeki Matsunaka, Kanagawa-ken (JP); Osamu Yamazaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 297 days.

(21) Appl. No.: 11/858,494

(22) Filed: Sep. 20, 2007

(65) Prior Publication Data

US 2008/0242087 A1   Oct. 2, 2008

(30) Foreign Application Priority Data

Mar. 28, 2007   (JP) ................... 2007-085194

(51) Int. Cl.
*C23C 14/35*   (2006.01)
(52) U.S. Cl. .............. 204/298.2; 204/298.19
(58) Field of Classification Search ............ 204/298.19, 204/298.2
See application file for complete search history.

(56) References Cited

U.S. PATENT DOCUMENTS

| | | | | |
|---|---|---|---|---|
| 5,164,063 A | * | 11/1992 | Braeuer et al. | 204/298.2 |
| 6,423,192 B1 | * | 7/2002 | Wada et al. | 204/192.12 |
| 6,440,282 B1 | * | 8/2002 | Wada et al. | 204/298.2 |
| 2004/0140204 A1 | * | 7/2004 | Navala et al. | 204/298.2 |

FOREIGN PATENT DOCUMENTS

| | | | |
|---|---|---|---|
| JP | 63-100180 | * | 5/1988 |
| JP | 06-136531 A | | 5/1994 |
| JP | 08-165568 | | 6/1996 |
| JP | 11-140639 | | 5/1999 |
| JP | 2001-192824 A | | 7/2001 |
| JP | 2003-328122 A | | 11/2003 |
| JP | 2004-218089 | | 5/2004 |

OTHER PUBLICATIONS

Japanese Office action for 2007-085194 dated Mar. 30, 2011.

* cited by examiner

*Primary Examiner* — Rodney McDonald
(74) *Attorney, Agent, or Firm* — Pearne & Gordon LLP (57) ABSTRACT

A magnetron sputtering apparatus includes: a target provided in a sputtering chamber; a susceptor opposed to the target; a high-frequency power supply connected to the susceptor; a plate provided outside the sputtering chamber and coaxial with a central axis of the target; a rotary motion mechanism configured to rotate the plate about the central axis; S-pole magnets placed on one side of the plate with their S-pole end directed to the target; and first and second N-pole magnets placed on the one side of the plate with their N-pole end directed to the target. The first N-pole magnets are placed along a circle coaxial with the plate and opposed to an outer peripheral vicinity of the target. The S-pole magnets are placed inside the first N-pole magnets and along a circle coaxial with the plate. The second N-pole magnets are placed inside the S-pole magnets and along a circle coaxial with the plate. Magnetic flux density of the first N-pole magnets and the second N-pole magnets are higher than magnetic flux density of the S-pole magnets.

11 Claims, 6 Drawing Sheets

RELEASE DISTRIBUTION OF CONSTITUENT ATOMS ON TARGET SURFACE

RELEASE DISTRIBUTION OF CONSTITUENT ATOMS ON TARGET SURFACE

MAGNETRON SPUTTERING APPARATUS AND METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2007-085194, filed on Mar. 28, 2007; the entire contents of which are incorporated herein by reference.

BACKGROUND OF THE INVENTION

1. Field of the Invention

This invention relates to a magnetron sputtering apparatus and a method for manufacturing a semiconductor device.

2. Background Art

The sputtering technique is one of the thin film formation techniques. In the sputtering technique, accelerated ions are collided against a target. Constituent atoms of the target are sputtered by the collision energy and attached to a workpiece opposed to the target.

The magnetron sputtering apparatus is one of the sputtering apparatuses using this sputtering technique for film formation on a workpiece. The magnetron sputtering apparatus forms a magnetic field crossing the electric field on the surface of a target, thereby causing electrons ejected from the cathode to undergo trochoidal motion, so that a high-density plasma is generated near the surface of the target.

Various techniques are proposed with regard to such a magnetron sputtering apparatus, including a technique for evenly sputtering the entire surface of the target to enhance the thickness uniformity of the formed film (see, e.g., JP-A 11-140639(Kokai) and JP-A 2004-218089(Kokai) and a technique for allowing a user to adjust the magnetic field configuration (JP-A 8-165568(Kokai)).

However, using these techniques in film formation for recent downsized semiconductor devices involves a problem of deterioration in the uniformity of film thickness, the symmetry of film formation configuration, and the coatability such as coverage ratio inside through holes and trenches near the wafer outer periphery.

SUMMARY OF THE INVENTION

According to an aspect of the invention, there is provided a magnetron sputtering apparatus including: a target provided in a sputtering chamber; a susceptor opposed to the target; a high-frequency power supply connected to the susceptor; a plate provided outside the sputtering chamber and coaxial with a central axis of the target; a rotary motion mechanism configured to rotate the plate about the central axis; S-pole magnets placed on one side of the plate with their S-pole end directed to the target; and first and second N-pole magnets placed on the one side of the plate with their N-pole end directed to the target, the first N-pole magnets being placed along a circle coaxial with the plate and opposed to an outer peripheral vicinity of the target, the S-pole magnets being placed inside the first N-pole magnets and along a circle coaxial with the plate, the second N-pole magnets being placed inside the S-pole magnets and along a circle coaxial with the plate, and magnetic flux density of the first N-pole magnets and the second N-pole magnets being higher than magnetic flux density of the S-pole magnets.

According to another aspect of the invention, there is provided a method for manufacturing a semiconductor device, including: performing film formation by using the magnetron sputtering apparatus including, a target provided in a sputtering chamber; a susceptor opposed to the target; a high-frequency power supply connected to the susceptor; a plate provided outside the sputtering chamber and coaxial with a central axis of the target; a rotary motion mechanism configured to rotate the plate about the central axis; S-pole magnets placed on one side of the plate with its S-pole end directed to the target; and first and second N-pole magnets placed on the one side of the plate with their N-pole end directed to the target, the first N-pole magnets being placed along a circle coaxial with the plate and opposed to an outer peripheral vicinity of the target, the S-pole magnets being placed inside the first N-pole magnets and along a circle coaxial with the plate, the second N-pole magnets being placed inside the S-pole magnets and along a circle coaxial with the plate, and magnetic flux density of the first N-pole magnets and the second N-pole magnets being higher than magnetic flux density of the S-pole magnets.

BRIEF DESCRIPTION OF THE DRAWINGS

FIGS. 4A to 4C are schematic views for illustrating the film formation state in a trench where the entire surface of the target 4 is evenly sputtered (a comparative example).

FIGS. 5A to 5C are schematic views for illustrating the film formation state in a trench where the outer peripheral vicinity of the target is evenly sputtered.

DETAILED DESCRIPTION OF THE INVENTION

An embodiment of the invention will now be described with reference to the drawings.

Figure 1:
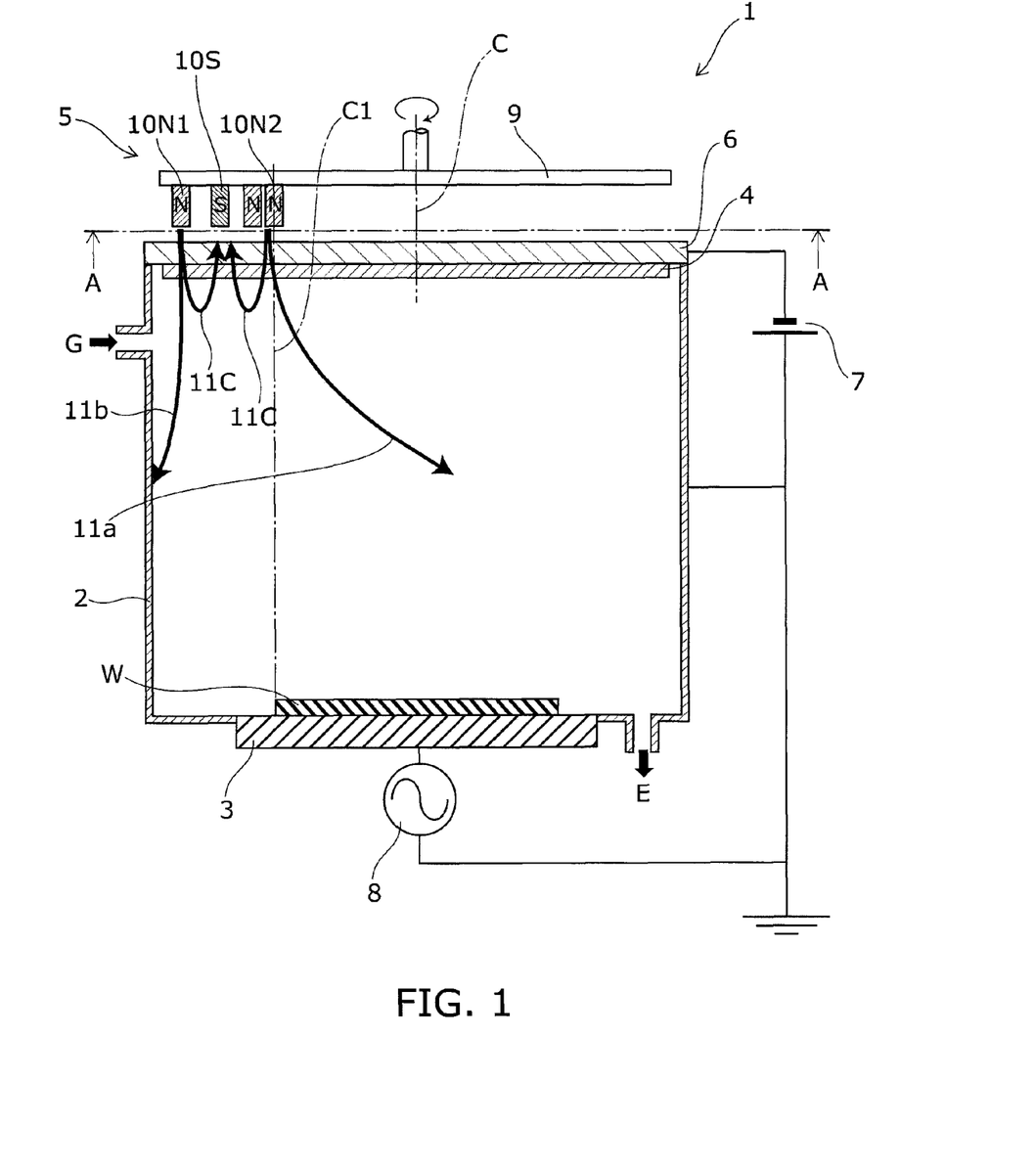
FIG. 1 is a schematic diagram for illustrating a magnetron sputtering apparatus according to the embodiment of the invention.

FIG. 1 is a schematic diagram for illustrating a magnetron sputtering apparatus according to the embodiment of the invention.

The magnetron sputtering apparatus 1 comprises a sputtering chamber 2 for receiving a wafer W and performing film formation, a susceptor 3 constituting the bottom of the sputtering chamber 2 and mounting the wafer W, a target 4 opposed to the susceptor 3, a magnet unit 5 opposed to the target 4 outside the sputtering chamber 2, a gas introduction means, not shown, for introducing gas G into the sputtering chamber 2, and a gas exhaust means, not shown, for exhausting (E) the sputtering chamber 2.

The susceptor 3 can be provided with an electrostatic chuck, not shown, for sucking and holding the wafer W. The susceptor 3 can be also provided with a cooling means, not shown, for cooling the wafer W. The cooling means is illustratively a means for passing coolant in the susceptor 3. It is preferable to provide such a cooling means for forming a metal film such as Cu (copper) film or Al (aluminum) film, which is susceptible to aggregation at increased wafer temperature due to ion bombardment. On the other hand, in the case of forming a film made of high melting point metal such as Ti (titanium), Ta (tantalum), W (tungsten), and Nb (niobium) or nitrides thereof, a heating means for heating the wafer W can be provided. The heating means is illustratively a means for passing heat medium in the susceptor 3 or a heater incorporated in the susceptor 3.

A high-frequency power supply 8 is electrically connected to the susceptor 3 so that a self-bias voltage is applied to the wafer W by the interaction between a plasma and a prescribed high-frequency voltage applied to the susceptor 3.

The target 4, which is composed of a material for film formation, is illustratively shaped like a circular disk and held on a backing plate 6. The backing plate 6 is provided with a cooling water channel, not shown, which serves to cool the target 4 from its backside. The backing plate 6 is electrically insulated from the sidewall of the sputtering chamber 2 and electrically connected to the negative electrode side of a DC power supply 7 so that a DC negative voltage required for sputtering can be applied to the target 4 through the backing plate 6. Furthermore, the DC power supply 7 is provided with a control means, not shown, so as to control electric power, voltage, and current. The sidewall of the sputtering chamber 2 is grounded.

The gas introduction means, not shown, is suitably provided with a gas supply means, a pressure regulation means, a flow rate regulation means, and a shut-off valve, so that at least one type of gas G can be introduced into the sputtering chamber 2. The gas G can be illustratively inert gas such as Ar (argon) gas, which has high sputtering ratio. The gas exhaust means, not shown, is suitably provided with a vacuum pump or other exhaust means, a pressure regulation means, a flow rate regulation means, and a shut-off valve, so that the pressure in the sputtering chamber 2 can be reduced to a prescribed level.

The magnet unit 5 is provided with a plate 9. An S-pole magnet 10S with its S pole directed to the target 4, a first N-pole magnet 10N1 with its N pole directed to the target 4, and a second N-pole magnet 10N2 with its N pole directed to the target 4 are placed on one side of the plate 9. The central axis of the plate 9 is coaxial with the central axis of the target 4. The plate 9 is rotatable about its central axis by a rotation means, not shown. Rotary motion of the magnet unit 5 enables the erosion region on the surface of the target 4 to be spread in the rotation direction.

The inventor has discovered that the coatability can be improved as described later if the central axis C1 of the magnet placed nearest to the rotation center C of the plate 9 is located outside the outer periphery position of the mounted wafer W as illustrated in FIG. 1.

Figure 2:
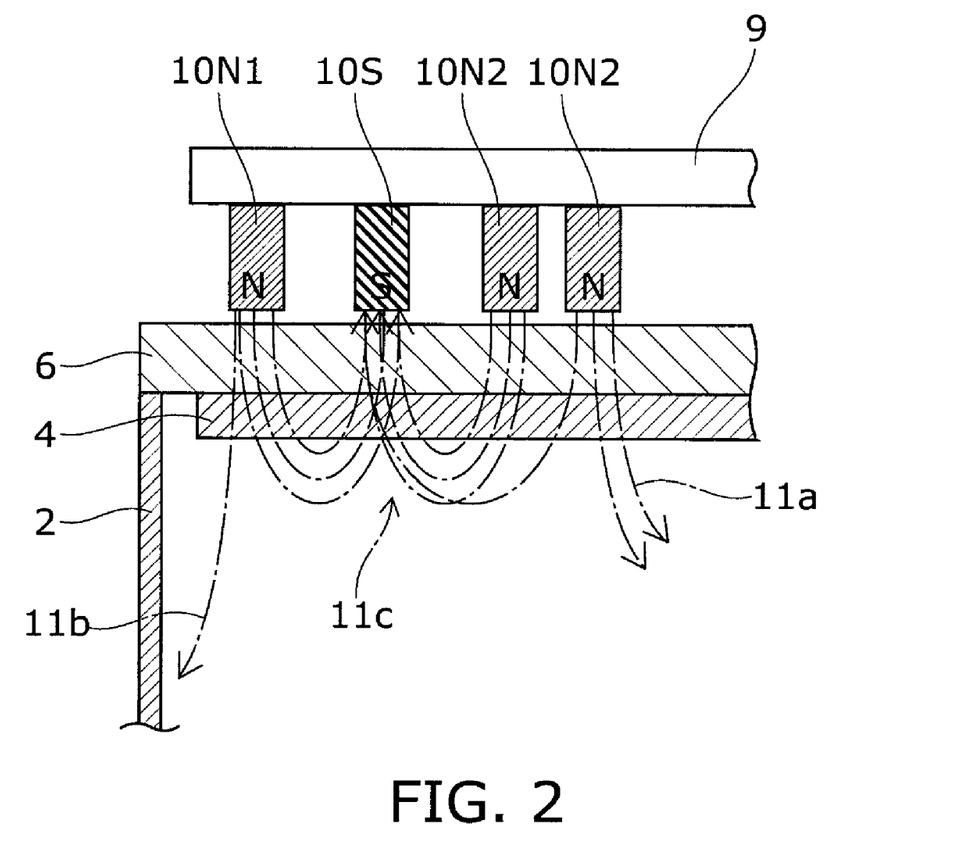
FIG. 2 is a schematic diagram for illustrating the installation of magnets.

FIG. 2 is a schematic diagram for illustrating the installation of magnets.

As shown in FIG. 2, a bar-shaped S-pole magnet 10S, first N-pole magnet 10N1, and second N-pole magnet 10N2 are placed on the plate 9 made of a ferromagnet. Hence the magnetic force can be maintained without impairing the anisotropy of the S-pole magnet 10S, first N-pole magnet 10N1, and second N-pole magnet 10N2. Here, the plate 9 itself does not necessarily need to be formed from a ferromagnet, but it is also possible to provide a plate-like yoke member made of a ferromagnet between the plate 9 and each magnet.

Here, if the magnetic flux density of the first N-pole magnet 10N1 and second N-pole magnet 10N2 is higher than the magnetic flux density of the S-pole magnet 10S, a magnetic field 11c directed from the N pole to the S pole and divergent magnetic fields 11a, 11b occur. Electrons are confined in the magnetic field 11c directed from the N pole to the S pole, generating a high-density plasma near the surface of the target 4.

On the other hand, the divergent magnetic fields 11a, 11b from the N pole serve to move electrons in the plasma away from the target 4. Here, due to the interaction between the magnetic moment of high-energy, circulating electrons and the magnetic field gradient of the divergent magnetic fields 11a, 11b, the electrons are accelerated in circular motion along the divergent magnetic fields 11a, 11b. Atoms released from the target 4 are thus ionized by the accelerated electrons. Hence proactive formation of the divergent magnetic fields serves to efficiently ionize the released constituent atoms of the target 4 by electrons accelerated in circular motion along the divergent magnetic fields. Accordingly, the ionization ratio of the released constituent atoms of the target 4 can be improved. This also serves to improve film formation efficiency and to facilitate highly directional film formation by the self-bias voltage.

Figure 3:
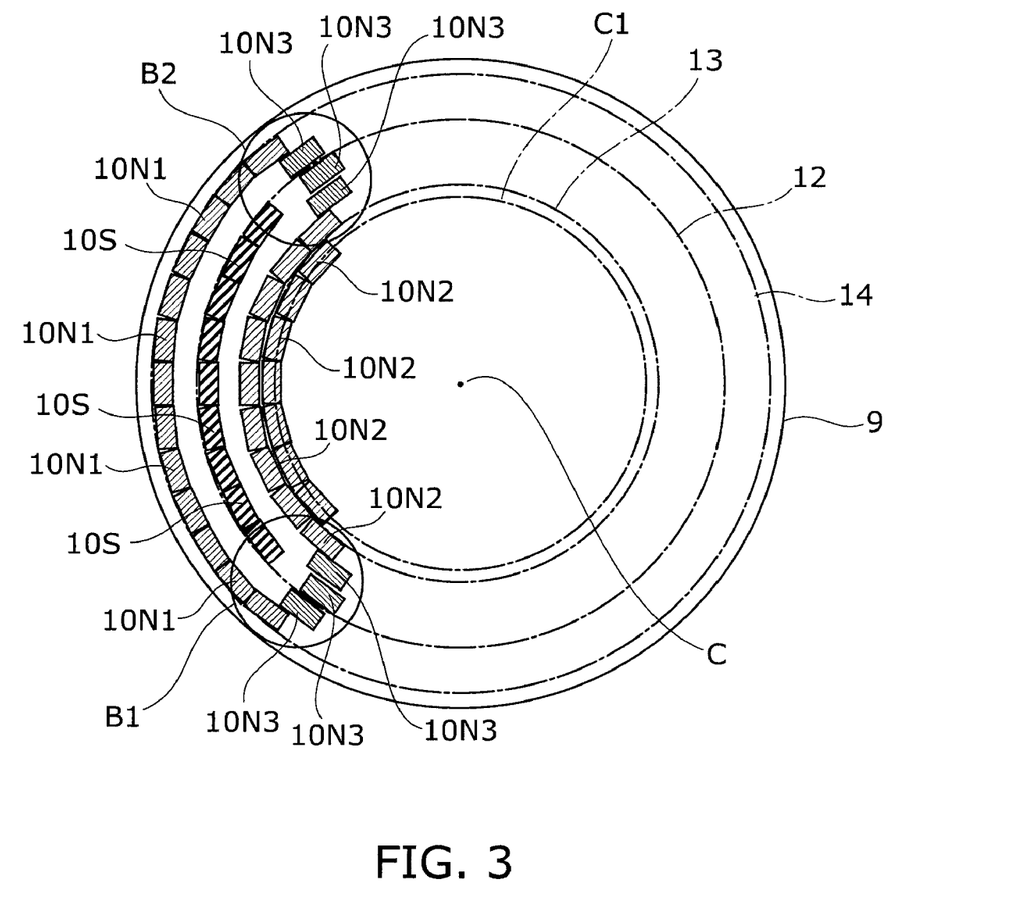
FIG. 3 is a schematic diagram for illustrating the arrangement of magnets, taken along the arrow A-A in FIG. 1.

FIG. 3 is a schematic diagram for illustrating the arrangement of magnets, taken along the arrow A-A in FIG. 1.

Each rectangle in FIG. 3 represents a magnet. The magnetic flux density of each magnet itself is assumed to be substantially identical. Thus the magnetic flux density can be increased by increasing the number of homopolar magnets in a prescribed direction.

As shown in FIG. 3, the S-pole magnets 10S are placed along a circle 12 about the rotation center C of the plate 9. In FIG. 3, a plurality of magnet elements are disposed to form the S-pole magnets 10S, however, the embodiment is not limited to this specific example. An arc-shaped single magnetic member along the circle 12 can be used instead of the S-pole magnets 10S. The second N-pole magnets 10N2 are placed along a circle 13 about the rotation center C, and the first N-pole magnets 10N1 are placed along a circle 14. That is, the first N-pole magnets 10N1 and the second N-pole magnets 10N2 are placed so as to interpose the S-pole magnets 10S therebetween.

Furthermore, N-pole magnets 10N2 are placed along a circle about the rotation center C also inside the second N-pole magnets 10N2 placed along the circle 13. That is, the second N-pole magnets 10N2 are placed in two rows.

With regard to the N-pole magnets 10N1 and 10N2, the embodiment is not limited to the specific example shown in FIG. 3 where they are made of a plurality of magnetic elements, respectively. Arc-shaped single magnetic members can be used instead of the N-pole magnets 10N1 and 10N2.

Here, the N-pole magnets 10N2 placed nearer to the rotation center C of the plate 9 (the N-pole magnets 10N2 nearer to the rotation center C of the N-pole magnets 10N2 placed in two rows) have a central axis C1 that is located outside the outer periphery position of the mounted wafer W.

Furthermore, as shown in portions B1, B2 of FIG. 3, third N-pole magnets 10N3 are placed between the first N-pole magnets 10N1 and the second N-pole magnets 10N2 so as to surround the S-pole magnets 10S.

The first N-pole magnets 10N1 are opposed to the outer peripheral vicinity of the target 4. Thus the first N-pole magnets 10N1, the S-pole magnets 10S, and the second N-pole magnets 10N2 are placed eccentrically in the outer periphery portion of the target 4. Consequently, a high-density plasma is generated near the outer periphery of the target 4, and the outer peripheral vicinity of the target 4 is sputtered substantially evenly by rotating the plate 9.

As described above, the N-pole magnets 10N2 placed nearer to the rotation center C of the plate 9 (the N-pole magnets 10N2 nearer to the rotation center C of the N-pole magnets 10N2 placed in two rows) have a central axis C1 that is located outside the outer periphery position of the mounted wafer W. Hence this region of the target 4 is sputtered substantially evenly.

Here, the circle 14 has a larger diameter than the circle 12. Hence the number of the first N-pole magnets 10N1 placed along the circumference of the circle 14 is larger than the number of the S-pole magnets 10S placed along the circumference of the circle 12. On the other hand, the circle 13 has a smaller diameter than the circle 12. However, because the second N-pole magnets 10N2 are placed in two rows, the number of the second N-pole magnets 10N2 is larger than the number of the S-pole magnets 10S placed along the circumference of the circle 12. Therefore the magnetic flux density of the first N-pole magnets 10N1 and second N-pole magnets 10N2 is higher than the magnetic flux density of the S-pole magnets 10S, forming divergent magnetic fields 11$a$, 11$b$.

Furthermore, in the portions B1, B2 of FIG. 3, three third N-pole magnets 10N3 are placed for one S-pole magnet 10S. Hence, a divergent magnetic field is circumferentially formed also in the portions B1, B2.

Formation of a divergent magnetic field is not limited to making the number of N-pole magnets larger than the number of S-pole magnets. What is needed is to make the magnetic flux density of the N pole higher than the magnetic flux density of the S pole.

The extent and reach of the divergent magnetic field and the ionization ratio can be controlled by adjusting the magnetic flux density of the N pole, the magnetic flux density of the S pole, and the arrangement of magnets.

Next, the operation of the magnetron sputtering apparatus 1 is described.

First, by a transport means, not shown, a wafer W is transported into the sputtering chamber 2, and mounted and held on the susceptor 3.

Next, the sputtering chamber 2 is hermetically closed, and the pressure in the sputtering chamber 2 is reduced to a prescribed level by an exhaust means, not shown.

Next, a prescribed amount of sputtering gas (e.g., Ar (argon) gas) is introduced into the sputtering chamber 2 by a gas introduction means, not shown. Then electric power is inputted from the DC power supply 7 through the backing plate 6 to the target 4, starting electrical discharge.

Electrons are confined in the magnetic field 11$c$ directed from the first N-pole magnets 10N1 and the second N-pole magnets 10N2 to the S-pole magnets 10S, and a high-density plasma of the sputtering gas is generated near the surface of the outer peripheral vicinity of the target 4. Sputtering gas ions (e.g., Ar (argon) ions) in this high-density plasma impinge on the target 4, and thereby constituent atoms of the target 4 are sputtered. The released constituent atoms are ionized in the high-density plasma. At this time, sputtering is performed while rotary motion of the magnet unit 5 causes the erosion region on the surface of the target 4 to be spread in the rotation direction.

On the other hand, a prescribed high-frequency voltage is applied from the high-frequency power supply 8 through the susceptor 3 to the wafer W. A self-bias voltage occurs in the wafer W by the interaction between this high-frequency voltage and the plasma. Ionized constituent atoms of the target 4 are accelerated toward the wafer W side and are incident on the surface of the wafer W in a substantially perpendicular direction. Hence highly directional film formation can be achieved.

However, in recent downsized semiconductor devices, film formation in a recess such as a through hole, trench, and step may involve a problem in coatability. For example, in a recess such as a through hole, trench, and step near the wafer outer periphery, film thickness may become nonuniform, and asymmetry may occur in film formation configuration.

Here, coatability in a recess such as a through hole, trench, and step is described, taking film formation in a trench as an example.

Figure 4A:
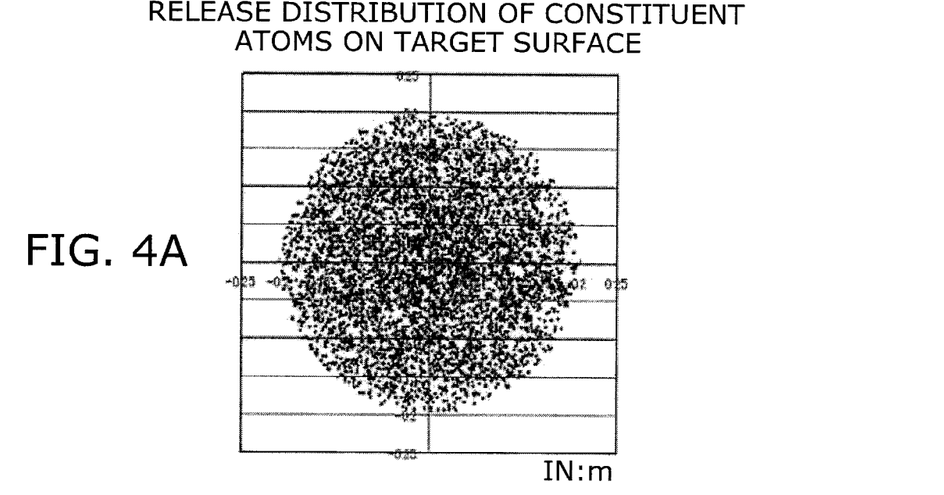
FIG. 4A is a schematic graph showing a release distribution of constituent atoms on the surface of the target.
Figure 4B:
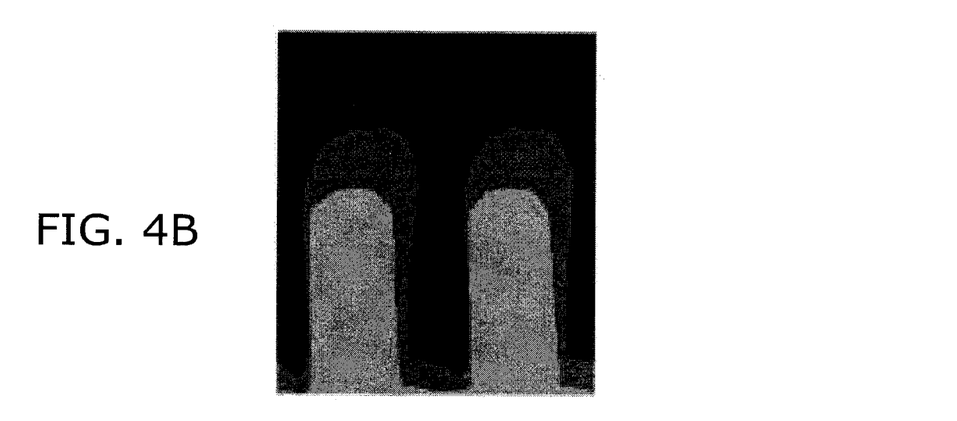
FIGS. 4B and 4C are schematic views of a simulated film formation state in a trench near the wafer outer periphery and near the wafer center, respectively.
Figure 4C:
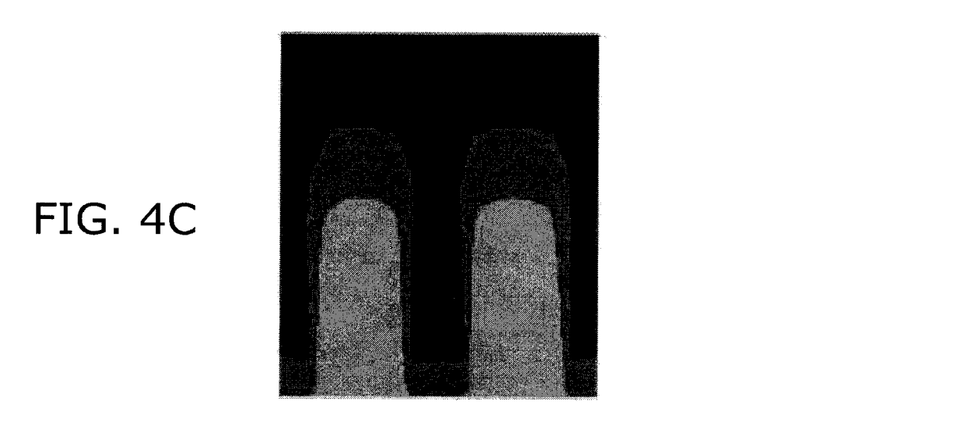

FIG. 4 is a schematic view for illustrating the film formation state in a trench where the entire surface of the target 4 is evenly sputtered, showing a comparative example investigated by the inventor in the course of reaching the invention.

FIG. 4A is a schematic graph for illustrating the release distribution of constituent atoms on the surface of the target 4.

FIG. 4A shows a result of evenly sputtering the entire surface of the target 4. Here, release of a constituent atom is represented by a black dot in the figure.

FIG. 4B is a schematic view of a simulated film formation state in a trench near the wafer outer periphery. The left side of the figure is the outer periphery side of the wafer W, and the right side is the center side of the wafer W.

FIG. 4C is a schematic view of a simulated film formation state in a trench near the wafer center.

As shown in FIG. 4C, in the trench near the wafer center, the film formed at the bottom is substantially good in the uniformity of film thickness, symmetry of film formation configuration, and bottom coverage ratio. However, as shown in FIG. 4B, in the outer peripheral vicinity of the wafer, the film formed at the bottom is deteriorated in the uniformity of film thickness, symmetry of film formation configuration, and bottom coverage ratio.

As described above, ionized constituent atoms of the target 4 are pulled to the surface of the wafer W by the self-bias voltage. Here, ionized constituent atoms of the target 4 generated directly above the portion to be film-formed are pulled in a substantially perpendicular direction. However, the atoms are pulled in a more oblique direction as their generated location is deviated from directly above. In particular, in film formation into a through hole or trench, obliquely incident ionized constituent atoms greatly affect the uniformity of film thickness and the symmetry of film formation configuration.

In film formation into a through hole or trench, the effect of obliquely incident ionized constituent atoms increases as the incident position on the wafer W is closer to its outer periphery. That is, as the position on the wafer W is away from its center and closer to its outer periphery, the horizontal distance from one edge of the target 4 increases, and the incidence angle of ions generated in this more distant portion becomes closer to the horizontal. Hence, as shown in FIG. 4B, on the bottom and sidewall of the trench, the film thickness decreases in the portion located on the center side of the wafer W, where ions are difficult to impinge, and the film thickness increases in the portion located on the outer periphery side of the wafer W, where ions are easy to impinge.

Consequently, the thickness of the film formed on the bottom of the trench becomes nonuniform, and also causes asymmetry in film formation configuration. The bottom coverage ratio is also deteriorated.

Also on the sidewall, the film formation thickness increases in the portion closer to the top of the trench, where ions are easy to impinge, and the film thickness increases in the portion located on the outer periphery side of the wafer W, where ions are easy to impinge. Consequently, the thickness of the film formed on the sidewall of the trench becomes nonuniform, and also causes asymmetry in film formation configuration.

On the other hand, as shown in FIG. 4C, on the bottom of the trench near the center of the wafer W, the oblique incidence angle is closer to the perpendicular. Thus the thickness of the film formed on the bottom is uniform, and the film formation configuration is symmetric. Furthermore, the value of bottom coverage ratio is improved.

Also on the sidewall, because the oblique incidence angle is closer to the perpendicular, the nonuniformity of film thickness and the asymmetry of film formation configuration are alleviated.

Examples of film formation in a through hole or trench include formation of a barrier metal film (diffusion prevention film) for preventing diffusion of Cu (copper) and a seed layer (Cu seed layer) in the case of forming Cu (copper) interconnects by the damascene process. In view of the purpose of forming a barrier metal film and a seed layer, it is desired to form a film with uniform thickness and symmetric film formation configuration on the entire inner surface of the through hole or trench.

As a result of investigations, the inventor has discovered that the coatability such as the uniformity of film thickness, symmetry of film formation configuration, and coverage ratio can be improved by evenly sputtering the outer peripheral vicinity of the target 4 without sputtering its center portion and by enhancing the ionization ratio of constituent atoms released from the target 4.

Figure 5A:
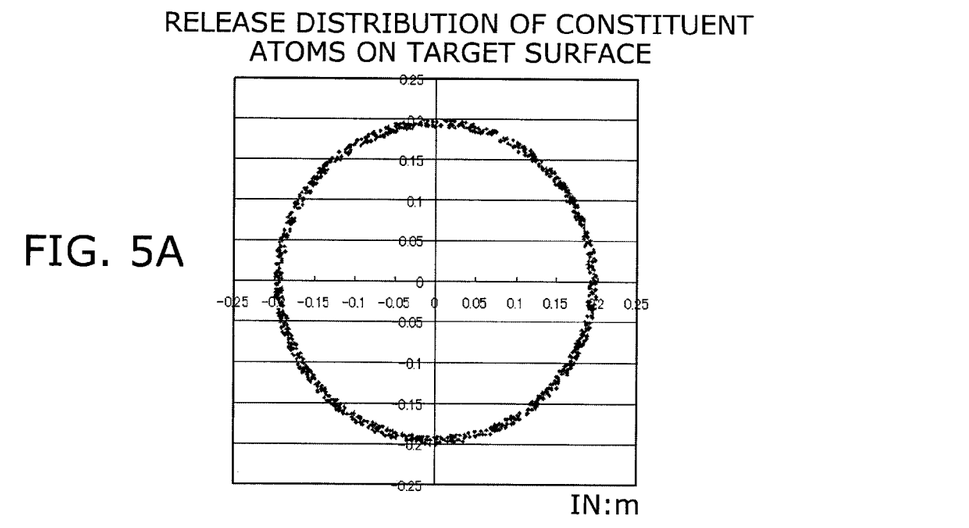
FIG. 5A is a schematic graph showing the release distribution of constituent atoms on the surface of the target.
Figure 5B:
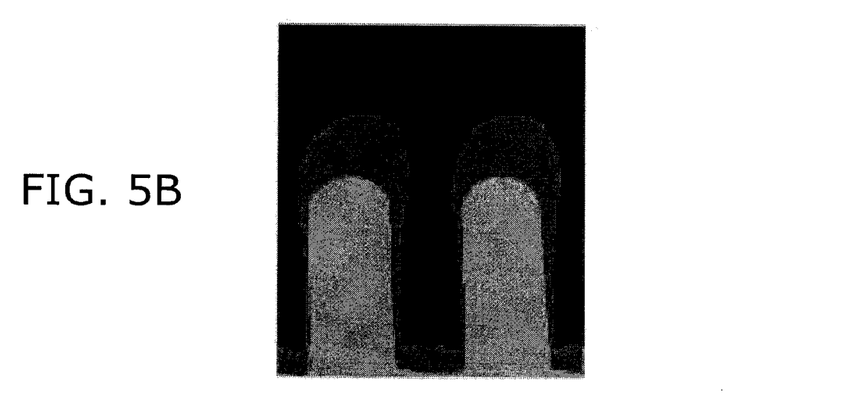
FIGS. 5B and 5C are schematic views of a simulated film formation state in a trench near the wafer outer periphery and near the wafer center, respectively.
Figure 5C:
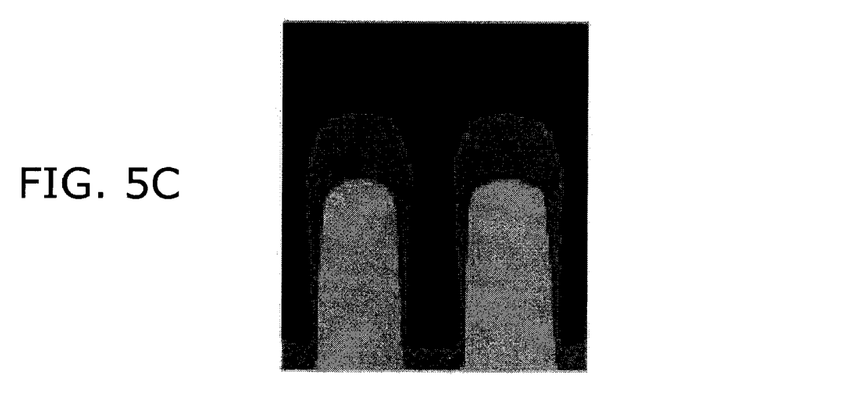

FIG. 5 is a schematic view for illustrating the film formation state in a trench where the outer peripheral vicinity of the target 4 is evenly sputtered.

FIG. 5A is a schematic graph for illustrating the release distribution of constituent atoms on the surface of the target 4.

FIG. 5A shows a result of evenly sputtering the outer peripheral vicinity of the target 4 without sputtering its center portion. Here, release of a constituent atom is represented by a black dot in the figure.

FIG. 5B is a schematic view of a simulated film formation state in a trench near the wafer outer periphery. The left side of the figure is the outer periphery side of the wafer W, and the right side is the center side of the wafer W.

FIG. 5C is a schematic view of a simulated film formation state in a trench near the wafer center.

As shown in FIG. 5C, in the trench near the wafer center, the uniformity of film thickness, symmetry of film formation configuration, and coverage ratio can reach a level comparable to those in the case of evenly sputtering the entire surface of the target 4 as described with reference to FIG. 4C.

Furthermore, as shown in FIG. 5B, in the outer peripheral vicinity of the wafer W, the film formed at the bottom can be significantly improved in the uniformity of film thickness, symmetry of film formation configuration, and bottom coverage ratio as compared with the case of evenly sputtering the entire surface of the target 4 as described with reference to FIG. 4B. Moreover, with regard to the sidewall, film formation can be performed near the bottom of the sidewall on the center side of the wafer W, where film formation itself is difficult in the case described with reference to FIG. 4B.

The reason for this is considered as follows.

In the case of evenly sputtering the outer peripheral vicinity of the target 4 without sputtering its center portion as shown in FIG. 5A, with regard to the trench near the outer periphery of the wafer W, constituent atoms ionized directly above the trench are primarily pulled into the trench. That is, when a high-density plasma is generated near the outer periphery of the target 4, the center portion is scarcely sputtered. Hence the amount of constituent atoms ionized in this center portion and impinging on the trench is negligible. Constituent atoms ionized near the outer periphery, opposed to and directly above the portion to be film-formed, are pulled to the portion to be film-formed, which is located directly below.

Hence, with regard to the trench near the outer periphery of the wafer W, constituent atoms ionized directly above the trench are primarily pulled into the trench. Thus obliquely incident ionized constituent atoms can be substantially restrained.

As described above, proactive formation of divergent magnetic fields by making the magnetic flux density of the N-pole magnets higher than the magnetic flux density of the S-pole magnets serves to ionize the released constituent atoms of the target 4 by electrons accelerated in circular motion along the divergent magnetic fields. This can improve the ionization ratio accordingly, and further facilitate highly directional film formation by the self-bias voltage.

Consequently, as described with reference to FIG. 5B, the film formed at the bottom of the trench can be improved in the uniformity of film thickness, symmetry of film formation configuration, and bottom coverage ratio. Improvement can be achieved also on the sidewall.

With regard to the trench near the wafer center, the horizontal distance is relatively short from the portion where the high-density plasma is generated. Hence the trench is less susceptible to obliquely incident ionized constituent atoms. Furthermore, constituent atoms are incident evenly from both sides. Hence good uniformity of film thickness, symmetry of film formation configuration, and coverage ratio can be achieved as shown in FIG. 5C even if the outer peripheral vicinity of the target 4 is evenly sputtered.

While the description has been given with reference to the trench for convenience, the same applies to the step portion, through hole, and via hole.

However, features with higher aspect ratio are more susceptible to the obliquely incident ionized constituent atoms described above, and hence enjoy greater improvement.

Next, a method for manufacturing a semiconductor device according to this embodiment is described.

The method for manufacturing a semiconductor device is performed by repeating a plurality of steps including the step of forming a pattern on a wafer surface by film formation, resist coating, exposure, development, etching, and resist removal, the step of inspecting the pattern, and the steps of cleaning, heat treatment, doping, diffusion, and planarization. The steps other than film formation in a trench or through hole described below can use known techniques for the respective steps, and hence are not further described.

For convenience, the description will be given with reference to a damascene process for a Cu (copper) interconnect using the magnetron sputtering apparatus 1 described above.

FIGS. 6A to 6F are schematic process cross-sectional views for illustrating the Cu (copper) interconnect process.

Figure 6A:
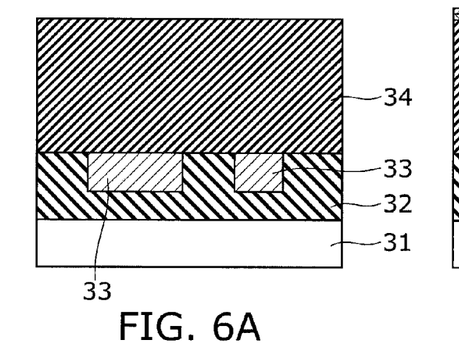
FIGS. 6A to 6F are schematic process cross-sectional views for illustrating the copper interconnect process.

First, as shown in FIG. 6A, a first interlayer insulating film 32, an underlying interconnect 33, and a second interlayer insulating film 34 are formed on a Si (silicon) substrate 31. The underlying interconnect 33 can be formed by a damascene process similar to that for the Cu interconnect (overlying interconnect) described with reference to FIGS. 6D to 6F, or can be formed by other methods. The underlying interconnect 33 can be a Cu (copper) interconnect, Al (aluminum) interconnect, or W (tungsten) interconnect.

Figure 6B:
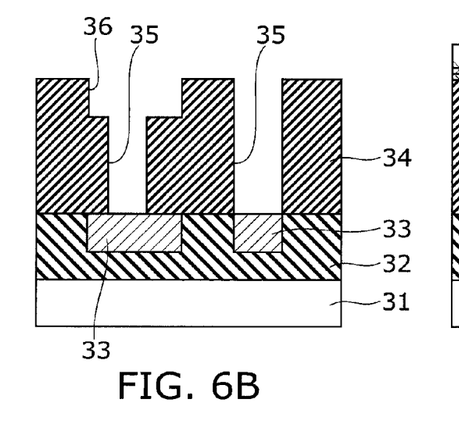

Next, as shown in FIG. 6B, for the purpose of connection to the underlying interconnect 33, a through hole 35 and an interconnection trench 36 are formed in the second interlayer insulating film 34.

Figure 6C:
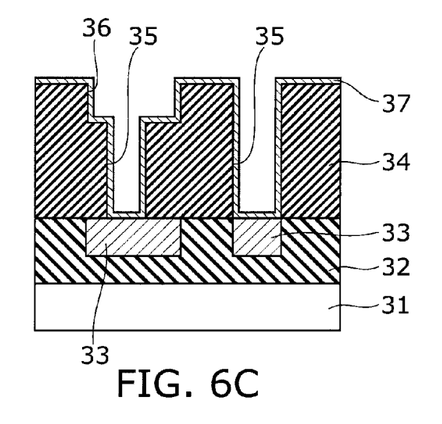

Next, as shown in FIG. 6C, by using the magnetron sputtering apparatus 1 according to this embodiment, a barrier metal film 37 for preventing diffusion of Cu (copper) into the second interlayer insulating film 34 is formed on the inner surface of the through hole 35 and the interconnection trench 36. The barrier metal film 37 can be illustratively a TaN (tantalum nitride) monolayer film, a laminated film of Ta (tantalum) film/TaN (tantalum nitride) film, or a laminated film of Ta (tantalum) film/TaN (tantalum nitride) film/Ta (tantalum) film. The process for forming the barrier metal film 37 is described later in detail.

Figure 6D:
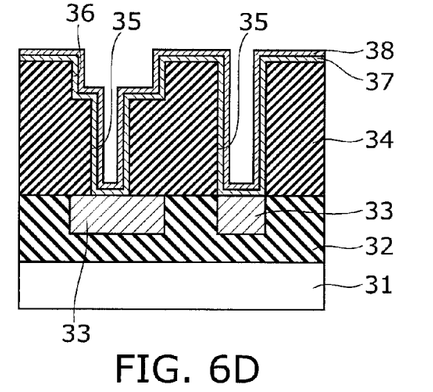

Next, as shown in FIG. 6D, by using the magnetron sputtering apparatus 1 according to this embodiment, a Cu (copper) seed layer 38 for Cu (copper) electrolytic plating is formed on the barrier metal film 37. The process for forming the Cu (copper) seed layer 38 is described later in detail.

Figure 6E:
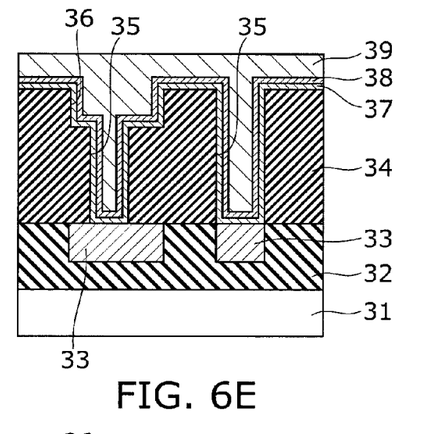

Next, as shown in FIG. 6E, by Cu (copper) electrolytic plating, a Cu (copper) film 39 is formed on the entire surface so as to fill in the through hole 35 and the interconnection trench 36.

Figure 6F:
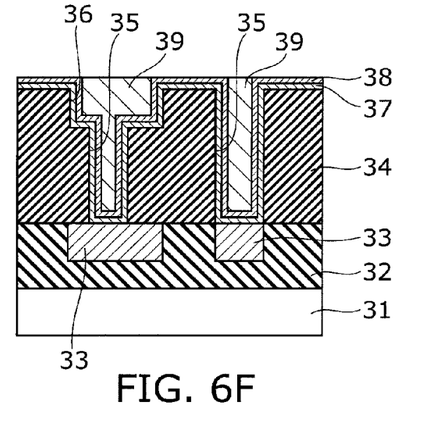

Next, as shown in FIG. 6F, the Cu (copper) film 39 outside the through hole 35 and the interconnection trench 36 is removed by CMP (chemical mechanical polishing). Thus the Cu (copper) interconnect is completed. In this process, trenches and through holes are formed beforehand in the interlayer insulating film, and the trenches and through holes are collectively filled in with a metal film to simultaneously form interconnects and plugs. This is called a dual damascene process.

The magnetron sputtering apparatus 1 according to this embodiment can be used in film formation other than for the barrier metal film 37 and the Cu (copper) seed layer 38. Furthermore, PVD (physical vapor deposition) or CVD (chemical vapor deposition) can also be used for forming the Cu (copper) film 39. Besides the dual damascene process, the magnetron sputtering apparatus 1 is also applicable to a Cu (copper) single damascene process for filling in only the trenches, and to a Cu (copper) plug for filling in only the through holes.

Here, if the barrier metal film 37 and the Cu (copper) seed layer 38 are poor in the uniformity of film thickness, symmetry of film formation configuration, and coverage ratio, then the function of these films is deteriorated. Furthermore, adhesion of the Cu (copper) film 39 to the through hole 35 and the interconnection trench 36 is deteriorated, and the Cu (copper) film 39 may peel off when the extra Cu (copper) film 39 is removed by CMP (chemical mechanical polishing).

By using the magnetron sputtering apparatus 1 according to this embodiment, the barrier metal film 37 and the Cu (copper) seed layer 38 can be improved in the uniformity of film thickness, symmetry of film formation configuration, and coverage ratio even in the outer peripheral vicinity of the wafer W. Hence it is possible to prevent the functional deterioration of the barrier metal film 37 and the Cu (copper) seed layer 38 and peel-off of the Cu (copper) film 39. This also serves to increase yield and productivity.

Next, the formation of the barrier metal film 37 described with reference to FIG. 6C is further described. For convenience of description, the barrier metal film 37 formed is assumed to be a TaN (tantalum nitride) film.

The barrier metal film 37 (TaN film) is intended to prevent Cu (copper) in the Cu (copper) interconnect from diffusing from the bottom and side faces of the interconnection trench and the through hole into the interlayer insulating film. For this reason, high uniformity of film thickness, symmetry of film formation configuration, and coverage ratio are desired for the barrier metal film 37 (TaN film) in the interconnection trench and the through hole. Deterioration of them may also cause the above peel-off of the Cu (copper) film 39.

In this embodiment, a description is given of the case of forming a TaN (tantalum nitride) film along with heating to decrease the stress of the TaN (tantalum nitride) film.

First, a wafer W is closely attached to the susceptor 3 by the electrostatic chuck incorporated in the susceptor 3, and the wafer W is heated by a heating means such as a heater incorporated in the susceptor 3. Next, Ar (argon) gas serving as a sputtering gas and $N_2$ (nitrogen) gas serving as a reaction gas are introduced into the sputtering chamber 2. In the case of a TaN (tantalum nitride) film, reactive sputtering is used, where a Ta (tantalum) target is used and $N_2$ (nitrogen) gas is introduced as a reaction gas.

Next, a negative voltage is applied to the target 4 (Ta target) to cause discharge.

At this time, a magnetic field 11c is formed by the N-pole magnet 10N and the S-pole magnet 10S. Electrons are confined in the magnetic field 11c, and a high-density plasma of Ar (argon) gas is generated near the surface of the target 4. Ar (argon) ions in this high-density plasma impinge on the target 4 (Ta target), and thereby constituent atoms (Ta) of the target 4 are sputtered. The released constituent atoms (Ta) are ionized in the high-density plasma. Sputtering is performed while rotary motion of the magnet unit 5 causes the erosion region on the surface of the target 4 to be spread in the rotation direction.

On the other hand, divergent magnetic fields 11a, 11b from the N pole serve to move electrons in the plasma away from the target 4. Here, due to the interaction between the magnetic moment of high-energy, circulating electrons and the magnetic field gradient of the divergent magnetic fields 11a, 11b, the electrons are accelerated in circular motion along the divergent magnetic fields 11a, 11b. Atoms (Ta) released from the target 4 are thus ionized by the accelerated electrons.

Next, a high-frequency AC voltage is applied to the wafer W.

In this embodiment, the surface of the wafer W is covered with an interlayer insulating film. Hence high-frequency power from the high-frequency power supply 8 can be inputted to the wafer W through a matching box, not shown. Here, a self-bias voltage is induced in the wafer W and results in the effect of pulling positive ions to the wafer W. The value of the self-bias voltage induced in the wafer W can be adjusted by adjusting the value of the high-frequency power.

This embodiment is described with reference to reactive sputtering of TaN (tantalum nitride). However, by using a target made of Ti (titanium), W (tungsten), or Nb (niobium) and introducing $N_2$ (nitrogen) gas, reactive sputtering of TiN (titanium nitride), WN (tungsten nitride), or NbN (niobium nitride) can be performed likewise. Furthermore, by using a target made of Ta (tantalum) and introducing $O_2$ (oxygen) gas, reactive sputtering of TaO (tantalum oxide) can be performed likewise.

As described above, according to this embodiment, the barrier metal film 37 can be improved in the uniformity of film thickness, symmetry of film formation configuration, and coverage ratio even in the outer peripheral vicinity of the wafer W. Hence it is possible to prevent the functional deterioration of the barrier metal film 37 and peel-off of the Cu (copper) film 39. This also serves to increase yield and productivity.

Next, the formation of the Cu (copper) seed layer 38 described with reference to FIG. 6D is further described.

First, a wafer W is closely attached to the susceptor 3 by the electrostatic chuck incorporated in the susceptor 3. During film formation, the wafer W is cooled by a cooling means incorporated in the susceptor 3. Next, Ar (argon) gas serving as a sputtering gas is introduced into the sputtering chamber 2.

Next, a negative voltage is applied to the target 4 (Cu target) to cause discharge.

At this time, a magnetic field 11c is formed by the N-pole magnet 10N and the S-pole magnet 10S. Electrons are confined in the magnetic field 11c, and a high-density plasma of Ar (argon) gas is generated near the surface of the target 4. Ar (argon) ions in this high-density plasma impinge on the target 4 (Cu target), and thereby constituent atoms (Cu) of the target 4 are sputtered. The released constituent atoms (Cu) are ionized in the high-density plasma. Sputtering is performed while rotary motion of the magnet unit 5 causes the erosion region on the surface of the target 4 to be spread in the rotation direction.

On the other hand, divergent magnetic fields 11a, 11b from the N pole serve to move electrons in the plasma away from the target 4. Here, due to the interaction between the magnetic moment of high-energy, circulating electrons and the magnetic field gradient of the divergent magnetic fields 11a, 11b, the electrons are accelerated in circular motion along the divergent magnetic fields 11a, 11b. Atoms (Cu) released from the target 4 are thus ionized by the accelerated electrons.

Next, a high-frequency AC voltage is applied to the wafer W.

In this embodiment, the surface of the wafer W is covered with an interlayer insulating film. Hence high-frequency power from the high-frequency power supply 8 can be inputted to the wafer W through a matching box, not shown. Here, a self-bias voltage is induced in the wafer W and results in the effect of pulling positive ions to the wafer W. The value of the self-bias voltage induced in the wafer W can be adjusted by adjusting the value of the high-frequency power.

In the case where Ar (argon) gas is introduced, Ar (argon) ions are also generated in addition to Cu (copper) ions. Hence, application of a negative voltage to the wafer W also causes Ar (argon) ions to be pulled perpendicular to the surface of the wafer W and physically etches the Cu (copper) seed layer 38 formed on the wafer W. The physically etched Cu (copper) reattaches to the inner surface of the through hole 35, and thereby the thickness of the Cu (copper) seed layer 38 on the side face of the through hole 35 can be increased.

As described above, according to this embodiment, the Cu (copper) seed layer 38 can be improved in the uniformity of film thickness, symmetry of film formation configuration, and coverage ratio even in the outer peripheral vicinity of the wafer W. Hence it is possible to prevent the functional deterioration of the Cu (copper) seed layer 38 and peel-off of the Cu (copper) film 39. This also serves to increase yield and productivity.

The embodiment of the invention has been described with reference to examples. However, the invention is not limited to these examples.

Any modifications to the above examples made by those skilled in the art are also encompassed within the scope of the invention as long as they include the features of the invention.

For example, the shape, dimension, material, and arrangement of the elements of the magnetron sputtering apparatus 1 are not limited to the above examples, but can be suitably modified.

Furthermore, the processing condition, cross-sectional configuration, dimension, material, and arrangement of the above semiconductor device are not limited to the above examples, but can be suitably modified.

Moreover, the invention is also applicable to manufacturing of precision electronic components and electronic devices such as MEMS (microelectromechanical systems) having trenches.

The elements of the above examples can be combined with each other as long as feasible, and such combinations are also encompassed within the scope of the invention as long as they include the features of the invention.

The invention claimed is:

1. A magnetron sputtering apparatus comprising:
   a target provided in a sputtering chamber;
   a susceptor opposed to the target;
   a high-frequency power supply connected to the susceptor;
   a plate provided outside the sputtering chamber and coaxial with a central axis of the target;
   a rotary motion mechanism configured to rotate the plate about the central axis;
   S-pole magnets placed on one side of the plate with their S-pole end directed to the target; and
   first and second N-pole magnets placed on the one side of the plate with their N-pole end directed to the target,
   the first N-pole magnets being placed along a circle coaxial with the plate and opposed to an outer peripheral vicinity of the target,
   the S-pole magnets being placed inside the first N-pole magnets and along a circle coaxial with the plate,
   the second N-pole magnets being placed inside the S-pole magnets and along a circle coaxial with the plate,
   the S-pole magnets, the first N-pole magnets and the second N-pole magnets being placed eccentrically in the outer periphery portion of the target,
   the second N-pole magnets having a central axis being located outside an outer periphery position of a wafer mounted on the susceptor, and
   magnetic flux density of the first N-pole magnets and the second N-pole magnets being higher than magnetic flux density of the S-pole magnets.

2. The magnetron sputtering apparatus according to claim 1, wherein a divergent magnetic field is generated from the first N-pole magnets and the second N-pole magnets.

3. The magnetron sputtering apparatus according to claim 1, wherein the second N-pole magnets are placed in two rows along a circle coaxial with the plate.

4. The magnetron sputtering apparatus according to claim 3, wherein the second N-pole magnets placed nearer to the rotation center of the plate has a central axis which is located outside an outer periphery position of a wafer which is mounted on the susceptor.

5. The magnetron sputtering apparatus according to claim 1, wherein a number of the first N-Pole magnets is larger than a number of the S-pole magnets.

6. The magnetron sputtering apparatus according to claim 1, wherein a number of the second N-Pole magnets is larger than a number of the S-pole magnets.

7. The magnetron sputtering apparatus according to claim 1, wherein a divergent magnetic field is circumferentially formed in an end position of the S-pole magnets.

8. The magnetron sputtering apparatus according to claim 1, further comprising:
   third N-pole magnets placed on the one side of the plate and between the first N-pole magnets and the second N-pole magnets with their N-pole end directed to the target, wherein
   the S-pole magnets are surrounded by the first N-pole magnets, the second N-pole magnets, and the third N-pole magnets.

9. The magnetron sputtering apparatus according to claim 1, wherein the outer peripheral vicinity of the target is sputtered substantially evenly by the rotary motion mechanism.

10. The magnetron sputtering apparatus according to claim 1, wherein the plate has a yoke member made of a ferromagnet and provided between the plate and the S-pole magnets.

11. The magnetron sputtering apparatus according to claim 1, wherein the plate has a yoke member made of a ferromagnet and provided between the plate and one of the first and second N-pole magnets.

* * * * *